US006983088B2

(12) United States Patent
Kubby et al.

(10) Patent No.: US 6,983,088 B2
(45) Date of Patent: Jan. 3, 2006

(54) THERMAL ACTUATOR AND AN OPTICAL WAVEGUIDE SWITCH INCLUDING THE SAME

(75) Inventors: Joel A. Kubby, Rochester, NY (US); Jun Ma, Penfield, NY (US); Kristine A. German, Webster, NY (US); Peter M. Gulvin, Webster, NY (US); Pinyen Lin, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 215 days.

(21) Appl. No.: 10/634,941

(22) Filed: Aug. 5, 2003

(65) Prior Publication Data

US 2005/0031288 A1    Feb. 10, 2005

(51) Int. Cl.
*G02B 6/26* (2006.01)
*G02B 6/42* (2006.01)
*H01H 37/00* (2006.01)

(52) U.S. Cl. .............................. 385/16; 385/14; 385/18; 385/19; 385/25; 385/40; 337/14; 337/123; 337/298; 337/305; 337/306; 337/382; 337/397

(58) Field of Classification Search ............... 385/4–5, 385/8–9, 14–19, 24–25, 27–28, 39–40, 52, 385/147, 50; 359/194, 223, 196; 310/307; 337/14, 123, 128, 135–136, 305–306, 382, 337/385, 391, 397
See application file for complete search history.

(56) References Cited

U.S. PATENT DOCUMENTS

| 5,364,497 A | * | 11/1994 | Chau et al. ................... 216/39 |
| 5,706,041 A | | 1/1998 | Kubby ......................... 347/65 |
| 5,851,412 A | | 12/1998 | Kubby ......................... 216/27 |
| 5,862,003 A | * | 1/1999 | Saif et al. .................... 359/871 |
| 5,870,518 A | * | 2/1999 | Haake et al. .................. 385/90 |
| 5,909,078 A | * | 6/1999 | Wood et al. ................. 310/307 |
| 5,955,817 A | * | 9/1999 | Dhuler et al. ............... 310/307 |
| 5,962,949 A | * | 10/1999 | Dhuler et al. ............... 310/307 |
| 5,994,816 A | * | 11/1999 | Dhuler et al. ............... 310/307 |

(Continued)

FOREIGN PATENT DOCUMENTS

WO    WO 01/99098 A2 * 12/2001

OTHER PUBLICATIONS

Yogesh B. Gianchandani and Khalil Najafi, "Bent-Beam Strain Sensors," Journal of Microelectromechanical Systems, vol. 5, No. 1, Mar. 1996, pp. 52-58.

(Continued)

*Primary Examiner*—Frank G. Font
*Assistant Examiner*—Ryan Lepisto
(74) *Attorney, Agent, or Firm*—Wayne J. Egan

(57) ABSTRACT

A thermal actuator comprises a plurality of substantially straight and parallel beams arranged to form a beam array. The midpoint of each beam is attached or coupled to an orthogonal coupling beam. Each array beam has a beam heating parameter with a corresponding beam heating parameter value. The beam heating parameter values vary across the beam array based on a predetermined pattern. As the beams are heated by an included heating means, the distribution of beam temperatures in the beam array becomes asymmetric, thus causing the beam array to buckle. The buckling of the beams in the beam array, in turn, causes the attached coupling beam to move in a predetermined direction. The coupling beam motion, in turn, operates an included optical waveguide switch. The beams in the beam array are heated by any of Joule heating, eddy current heating, conduction heating, convection heating and radiation heating.

58 Claims, 6 Drawing Sheets

U.S. PATENT DOCUMENTS

| | | | | |
|---|---|---|---|---|
| 6,002,507 | A | 12/1999 | Floyd et al. | 359/201 |
| 6,014,240 | A | 1/2000 | Floyd et al. | 359/201 |
| 6,023,121 | A * | 2/2000 | Dhuler et al. | 310/307 |
| 6,114,794 | A * | 9/2000 | Dhuler et al. | 310/307 |
| 6,124,663 | A * | 9/2000 | Haake et al. | 310/307 |
| 6,133,670 | A * | 10/2000 | Rodgers et al. | 310/309 |
| 6,137,206 | A * | 10/2000 | Hill | 310/306 |
| 6,218,762 | B1 * | 4/2001 | Hill et al. | 310/307 |
| 6,236,139 | B1 * | 5/2001 | Hill et al. | 310/307 |
| 6,255,757 | B1 * | 7/2001 | Dhuler et al. | 310/307 |
| 6,262,512 | B1 * | 7/2001 | Mahadevan | 310/307 |
| 6,275,320 | B1 * | 8/2001 | Dhuler et al. | 359/237 |
| 6,291,922 | B1 * | 9/2001 | Dhuler | 310/307 |
| 6,303,885 | B1 * | 10/2001 | Hichwa et al. | 200/181 |
| 6,308,631 | B1 * | 10/2001 | Smith et al. | 102/254 |
| 6,324,748 | B1 * | 12/2001 | Dhuler et al. | 29/622 |
| 6,333,583 | B1 * | 12/2001 | Mahadevan et al. | 310/306 |
| 6,351,580 | B1 * | 2/2002 | Dhuler et al. | 385/19 |
| 6,360,539 | B1 * | 3/2002 | Hill et al. | 60/528 |
| 6,362,512 | B1 | 3/2002 | Kubby et al. | 257/415 |
| 6,367,251 | B1 * | 4/2002 | Wood | 60/528 |
| 6,379,989 | B1 | 4/2002 | Kubby et al. | 438/52 |
| 6,386,507 | B2 * | 5/2002 | Dhuler et al. | 251/11 |
| 6,388,359 | B1 * | 5/2002 | Duelli et al. | 310/309 |
| 6,422,011 | B1 * | 7/2002 | Sinclair | 60/528 |
| 6,428,173 | B1 * | 8/2002 | Dhuler et al. | 359/872 |
| 6,658,179 | B2 * | 12/2003 | Kubby et al. | 385/24 |
| 6,675,578 | B1 * | 1/2004 | Sinclair | 60/528 |
| 6,700,299 | B2 * | 3/2004 | Quenzer et al. | 310/311 |
| 6,708,492 | B2 * | 3/2004 | Sinclair | 60/527 |
| 6,734,597 | B1 * | 5/2004 | Howell et al. | 310/306 |
| 6,747,773 | B2 * | 6/2004 | Theil et al. | 359/237 |
| 6,753,582 | B2 * | 6/2004 | Ma | 257/415 |
| 6,754,243 | B2 * | 6/2004 | Missey et al. | 372/20 |
| 6,771,158 | B2 * | 8/2004 | Lee et al. | 337/36 |
| 6,804,959 | B2 * | 10/2004 | Sinclair | 60/527 |
| 6,828,887 | B2 * | 12/2004 | Kubby et al. | 335/78 |
| 6,853,765 | B1 * | 2/2005 | Cochran | 385/23 |
| 2002/0174891 | A1 * | 11/2002 | Maluf et al. | 137/14 |
| 2002/0190603 | A1 * | 12/2002 | Ma et al. | 310/309 |
| 2003/0029705 | A1 * | 2/2003 | Qiu et al. | 200/181 |
| 2003/0053231 | A1 * | 3/2003 | Missey et al. | 359/872 |
| 2003/0086641 | A1 * | 5/2003 | Kubby et al. | 385/24 |
| 2003/0121260 | A1 * | 7/2003 | Sinclair | 60/527 |
| 2003/0132822 | A1 * | 7/2003 | Ko et al. | 335/78 |
| 2003/0134445 | A1 | 7/2003 | Kubby | 438/31 |
| 2003/0210115 | A1 * | 11/2003 | Kubby et al. | 335/78 |
| 2004/0184709 | A1 * | 9/2004 | Kubby et al. | 385/16 |
| 2004/0184710 | A1 * | 9/2004 | Kubby et al. | 385/16 |
| 2004/0184720 | A1 * | 9/2004 | Kubby | 385/22 |
| 2004/0184760 | A1 * | 9/2004 | Kubby et al. | 385/147 |

OTHER PUBLICATIONS

Long Que, Jae-Sung Park and Yogesh B. Gianchandani, "Bent-Beam Electrothermal Actuators," Journal of Microelectromechanical Systems, vol. 10, No. 2, Jun. 2001, pp. 247-254.

John M. Maloney, Don L. DeVoe and David S. Schreiber, "Analysis and Design of electrothermal Actuators Fabricated from Single Crystal Silicon," Proceedings ASME International Mechanical Engineering Conference and Exposition, Orlando, FL, pp. 233-240, 2000.

* cited by examiner

THERMAL ACTUATOR AND AN OPTICAL WAVEGUIDE SWITCH INCLUDING THE SAME

INCORPORATION BY REFERENCE OF OTHER PATENTS, PATENT APPLICATIONS AND PUBLICATIONS

The disclosures of the following thirteen (13) U.S. patents are hereby incorporated by reference, verbatim, and with the same effect as though the same disclosures were fully and completely set forth herein:

Joel Kubby, U.S. Pat. No. 5,706,041, "Thermal ink-jet printhead with a suspended heating element in each ejector," issued Jan. 6, 1998;

Joel Kubby, U.S. Pat. No. 5,851,412, "Thermal ink-jet printhead with a suspended heating element in each ejector," issued Dec. 22, 1998;

Joel Kubby et al., U.S. Pat. No. 6,362,512, "Microelectromechanical structures defined from silicon on insulator wafers," issued Mar. 26, 2002;

Joel Kubby et al., U.S. Pat. No. 6,379,989, "Process for manufacture of microoptomechanical structures," issued Apr. 30, 2002;

Phillip D. Floyd et al., U.S. Pat. No. 6,002,507, "Method and apparatus for an integrated laser beam scanner," issued Dec. 14, 1999;

Phillip D. Floyd et al., U.S. Pat. No. 6,014,240, "Method and apparatus for an integrated laser beam scanner using a carrier substrate," issued Jan. 11, 2000;

Robert L. Wood et al., U.S. Pat. No. 5,909,078, "Thermal arched beam microelectromechanical actuators," issued Jun. 1, 1999;

Vijayakumar R. Dhuler et al., U.S. Pat. No. 5,994,816, "Thermal arched beam microelectromechanical devices and associated fabrication methods," issued Nov. 30, 1999;

Vijayakumar R. Dhuler et al., U.S. Pat. No. 6,023,121, "Thermal arched beam microelectromechanical structure," issued Feb. 8, 2000;

Vijayakumar R. Dhuler et al., U.S. Pat. No. 6,114,794, "Thermal arched beam microelectromechanical valve," issued Sep. 5, 2000;

Vijayakumar R. Dhuler et al., U.S. Pat. No. 6,255,757, "Microactuators including a metal layer on distal portions of an arched beam," issued Jul. 3, 2001;

Vijayakumar R. Dhuler et al., U.S. Pat. No. 6,324,748, "Method of fabricating a microelectro mechanical structure having an arched beam," issued Dec. 4, 2001; and Edward A. Hill et al., U.S. Pat. No. 6,360,539, "Microelectromechanical actuators including driven arched beams for mechanical advantage," issued Mar. 26, 2002.

The disclosures of the following four (4) U.S. patent applications are hereby incorporated by reference, verbatim, and with the same effect as though the same disclosures were fully and completely set forth herein:

Joel Kubby, U.S. patent application Ser. No. 09/683,533, "Systems and methods for thermal isolation of a silicon structure," filed Jan. 16, 2002, now U.S. Patent Application Publication No. 20030134445, published Jul. 17, 2003, Joel Kubby, U.S. patent application No. 60/456,086, "M×N Cantilever Beam Optical Waveguide Switch," filed Mar. 19, 2003, Joel Kubby et al., U.S. patent application Ser. No. 09/986,395, "Monolithic reconfigurable optical multiplexer systems and methods," filed Nov. 8, 2001, now U.S. Patent Application Publication No. 20030086641, published May 8, 2003, and Joel Kubby et al., U.S. Patent Application No. 60/456,063, "MEMS Optical Latching Switch," filed Mar. 19, 2003.

The disclosures of the following three (3) publications are hereby incorporated by reference, verbatim, and with the same effect as though the same disclosures were fully and completely set forth herein:

Yogesh B. Gianchandani and Khalil Najafi, "Bent-Beam Strain Sensors," Journal of Microelectromechanical Systems, Vol. 5, No.1, March 1996, pages 52–58;

Long Que, Jae-Sung Park and Yogesh B. Gianchandani, "Bent-Beam Electrothermal Actuators," Journal of Microelectromechanical Systems, Vol. 10, No.2, June 2001, pages 247–254; and John M. Maloney, Don L. DeVoe and David S. Schreiber, "Analysis and Design of electrothermal Actuators Fabricated from Single Crystal Silicon," Proceedings ASME International Mechanical Engineering Conference and Exposition, Orlando, Fla., pages 233–240, 2000.

FIELD OF THE INVENTION

This application relates generally to thermal actuators and more particularly to a thermal actuator that is suitable for use in an optical waveguide switch.

BACKGROUND OF THE INVENTION

The traditional thermal actuator, the "V-beam" actuator, is widely used in microelectromechanical or "MEMS" structures. Such actuators are described in U.S. Pat. No. 5,909,078 to Robert L. Wood et al.; and in the U.S. patents to Vijayakumar R. Dhuler et al., U.S. Pat. No. 5,994,816, U.S. Pat. No. 6,023,121, U.S. Pat. No. 6,114,794, U.S. Pat. No. 6,255,757 and U.S. Pat. No. 6,324,748; and in U.S. Pat. No. 6,360,539 to Edward A. Hill et al., all of the foregoing patents being incorporated by reference herein; and in the publication of Long Que, Jae-Sung Park and Yogesh B. Gianchandani, "Bent-Beam Electrothermal Actuators"; and in the publication of John M. Maloney, Don L. DeVoe and David S. Schreiber, "Analysis and Design of Electrothermal Actuators Fabricated from Single Crystal Silicon," both of which publications are incorporated by reference herein.

However, these actuators are sensitive to residual stresses, especially the stress introduced by doping during fabrication of the actuator.

Indeed, the bent-beam geometry used in these actuators has been used in bent-beam strain sensors to measure residual stress as described in the publication of Yogesh B. Gianchandani and Khalil Najafi, "Bent-Beam Strain Sensors," which publication is incorporated by reference herein.

The residual stress in the V-beam actuator acts to deflect the V-beams away from their originally-designed target locations since the beam angle gives rise to a transverse force. Moreover, when such a V-beam actuator is used in an optical waveguide switch, this residual stress results in waveguide misalignment. The amount of optical loss caused by this waveguide misalignment is substantial. As a result, currently the V-beam actuator is generally unacceptable for use in an optical waveguide switch.

Thus, there is a need for an actuator that is acceptable for use in an optical waveguide switch.

SUMMARY OF THE INVENTION

In a first aspect of the invention, there is described a thermal actuator comprising a substrate having a surface; a first support and a second support disposed on the surface and extending orthogonally therefrom, a plurality of beams extending in parallel between the first support and the second support, thus forming a beam array, each beam being agonic and substantially straight; each beam of the beam array having a beam width with a corresponding beam width value, the beams in the beam array having beam width values that vary based on a predetermined pattern; and an included coupling beam extending orthogonally across the beam array to couple each array beam substantially at its midpoint.

In a second aspect of the invention, there is described a thermal actuator comprising a substrate having a surface; a first support and a second support disposed on the surface and extending orthogonally therefrom, a plurality of beams extending in parallel between the first support and the second support, thus forming a beam array, each beam being agonic and substantially straight; each pair of adjacent beams in the beam array defining a beam spacing with a corresponding beam spacing value, the pairs of adjacent beams in the beam array having beam spacing values that vary based on a predetermined pattern; and an included coupling beam extending orthogonally across the beam array to couple each array beam substantially at its midpoint.

In a third aspect of the invention, there is described a thermal actuator comprising a substrate having a surface; a first support and a second support disposed on the surface and extending orthogonally therefrom, a plurality of beams extending in parallel between the first support and the second support, thus forming a beam array, each beam being agonic and substantially straight; each beam of the beam array having a beam resistance with a corresponding beam resistance value, the beams in the beam array having beam resistance values that vary based on a predetermined pattern; and an included coupling beam extending orthogonally across the beam array to couple each array beam substantially at its midpoint.

In a fourth aspect of the invention, there is described a thermal actuator comprising a substrate having a surface; a first support and a second support disposed on the surface and extending orthogonally therefrom, a plurality of beams extending in parallel between the first support and the second support, thus forming a beam array, each beam being agonic and substantially straight; each beam of the beam array having a beam heating parameter with a corresponding beam heating parameter value, the beams in the beam array having beam heating parameter values that vary based on a predetermined pattern; and an included coupling beam extending orthogonally across the beam array to couple each array beam substantially at its midpoint.

In a fifth aspect of the invention, there is described an optical waveguide switch comprising a thermal actuator, the thermal actuator comprising a substrate having a surface; a first support and a second support disposed on the surface and extending orthogonally therefrom, a plurality of beams extending in parallel between the first support and the second support, thus forming a beam array, each beam being agonic and substantially straight; each beam of the beam array having a beam width with a corresponding beam width value, the beams in the beam array having beam width values that vary based on a predetermined pattern; and an included coupling beam extending orthogonally across the beam array to couple each array beam substantially at its midpoint.

In a sixth aspect of the invention, there is described an optical waveguide switch comprising a thermal actuator, the thermal actuator comprising a substrate having a surface; a first support and a second support disposed on the surface and extending orthogonally therefrom, a plurality of beams extending in parallel between the first support and the second support, thus forming a beam array, each beam being agonic and substantially straight; each pair of adjacent beams in the beam array defining a beam spacing with a corresponding beam spacing value, the pairs of adjacent beams in the beam array having beam spacing values that vary based on a predetermined pattern; and an included coupling beam extending orthogonally across the beam array to couple each array beam substantially at its midpoint.

In a seventh aspect of the invention, there is described an optical waveguide switch comprising a thermal actuator, the thermal actuator comprising a substrate having a surface; a first support and a second support disposed on the surface and extending orthogonally therefrom, a plurality of beams extending in parallel between the first support and the second support, thus forming a beam array, each beam being agonic and substantially straight; each beam of the beam array having a beam resistance with a corresponding beam resistance value, the beams in the beam array having beam resistance values that vary based on a predetermined pattern; and an included coupling beam extending orthogonally across the beam array to couple each array beam substantially at its midpoint.

In an eighth aspect of the invention, there is described an optical waveguide switch comprising a thermal actuator, the thermal actuator comprising a substrate having a surface; a first support and a second support disposed on the surface and extending orthogonally therefrom, a plurality of beams extending in parallel between the first support and the second support, thus forming a beam array, each beam being agonic and substantially straight; each beam of the beam array having a beam heating parameter with a corresponding beam heating parameter value, the beams in the beam array having beam heating parameter values that vary based on a predetermined pattern; and an included coupling beam extending orthogonally across the beam array to couple each array beam substantially at its midpoint.

BRIEF DESCRIPTION OF THE SEVERAL VIEWS OF THE DRAWING

FIG. 4 is an elevated top-down "birds-eye" view of the thermal actuator 200, including a first reference line 5 and a second reference line 6.

FIG. 5 is a first "cut-away" side or profile view of the thermal actuator 200 along the FIG. 4 first reference line 5.

FIG. 6 is a second "cut-away" side or profile view of the thermal actuator 200 along the FIG. 4 second reference line 6.

FIG. 7 is an elevated top-down "birds-eye" view of the thermal actuator 300, including a first reference line 8 and a second reference line 9.

FIG. 8 is a first "cut-away" side or profile view of the thermal actuator 300 along the FIG. 7 first reference line 8.

FIG. 9 is a second "cut-away" side or profile view of the thermal actuator 300 along the FIG. 7 second reference line 9.

FIG. 10 is an elevated top-down "birds-eye" view of the thermal actuator 400, including a first reference line 11 and a second reference line 12.

FIG. 11 is a first "cut-away" side or profile view of the thermal actuator 400 along the FIG. 10 first reference line 11.

FIG. 12 is a second "cut-away" side or profile view of the thermal actuator 400 along the FIG. 10 second reference line 12.

DETAILED DESCRIPTION OF THE INVENTION

Briefly, in accordance with the present invention, a thermal actuator comprises a plurality of substantially straight and parallel beams arranged to form a beam array. The midpoint of each beam is attached or coupled to an orthogonal coupling beam. Each array beam has a beam heating parameter with a corresponding beam heating parameter value. The beam heating parameter values vary across the beam array based on a predetermined pattern. As the beams are heated by an included heating means, the distribution of beam temperatures in the beam array becomes asymmetric, thus causing the beam array to buckle. The buckling of the beams in the beam array, in turn, causes the attached coupling beam to move in a predetermined direction. The coupling beam motion, in turn, operates an included optical waveguide switch. The beams in the beam array are heated by any of Joule heating, eddy current heating, conduction heating, convection heating and radiation heating.

Figure 1:
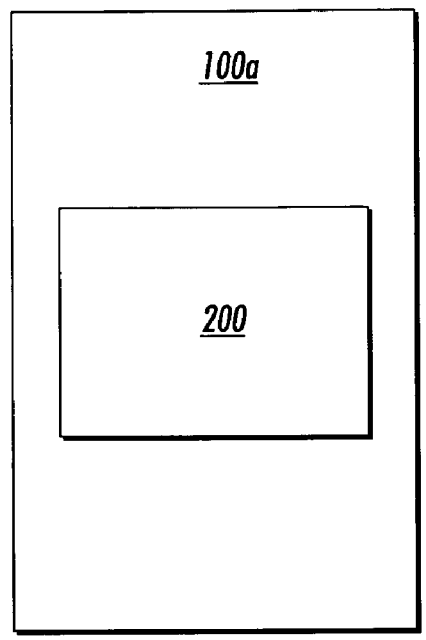
FIG. 1 is a block diagram of an optical waveguide switch 100a comprising a first embodiment 200 of a thermal actuator in accordance with the invention.

Referring now to FIG. 1, there is shown a block diagram of an optical waveguide switch 100a comprising a first embodiment 200 of a thermal actuator in accordance with the invention. The thermal actuator 200 is described in greater detail in connection with FIGS. 4–6 below.

Figure 2:
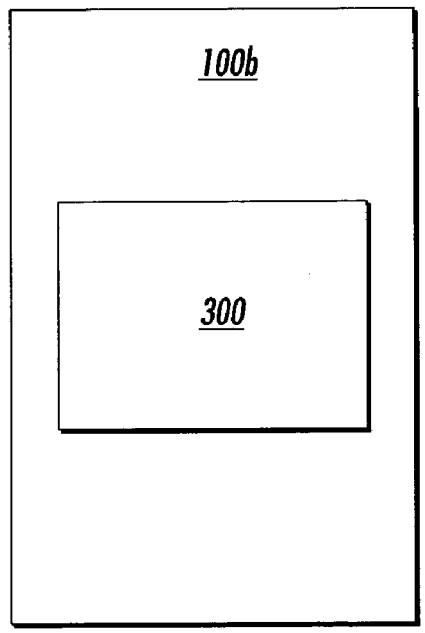
FIG. 2 is a block diagram of an optical waveguide switch 100b comprising a second embodiment 300 of thermal actuator in accordance with the invention.

Referring now to FIG. 2, there is shown a block diagram of an optical waveguide switch 100b comprising a second embodiment 300 of thermal actuator in accordance with the invention. The thermal actuator 300 is described in greater detail in connection with FIGS. 7–9 below.

Figure 3:
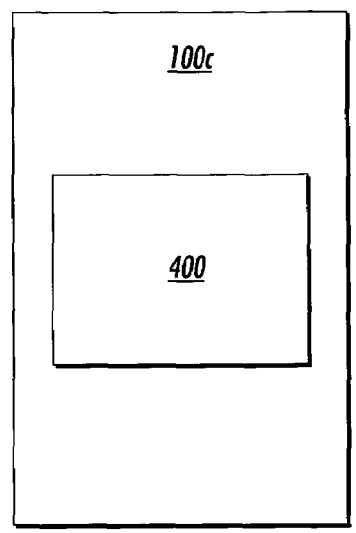
FIG. 3 is a block diagram of an optical waveguide switch 100c comprising a third embodiment 400 of a thermal actuator in accordance with the invention.

Referring now to FIG. 3, there is shown a block diagram of an optical waveguide switch 100c comprising a third embodiment 400 of a thermal actuator in accordance with the invention. The thermal actuator 400 is described in greater detail in connection with FIGS. 10–12 below.

Examples of optical waveguide switches that incorporate thermal actuators have been described in the application of Joel Kubby, U.S. Patent Application No. 60/456,086, filed Mar. 19, 2003; and in the applications of Joel Kubby et al., U.S. patent application Ser. No. 09/986,395, filed Nov. 8, 2001, now U.S. Patent Application Publication No. 20030086641, published May 8, 2003; and U.S. Patent Application No. 60/456,063, filed Mar. 19, 2003, all of the foregoing patent applications being incorporated by reference herein.

Figure 4:
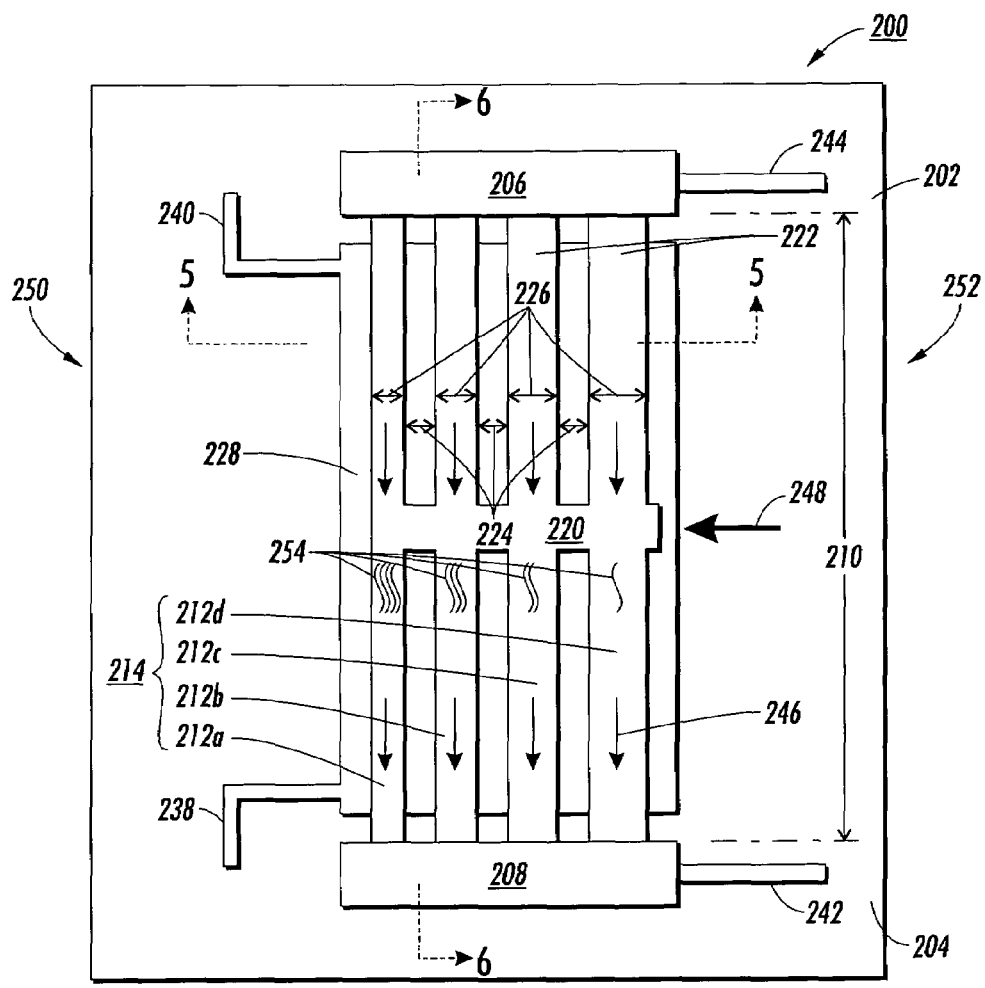
FIGS. 4–6 depict the first embodiment 200 of the thermal actuator as follows.
Figure 5:
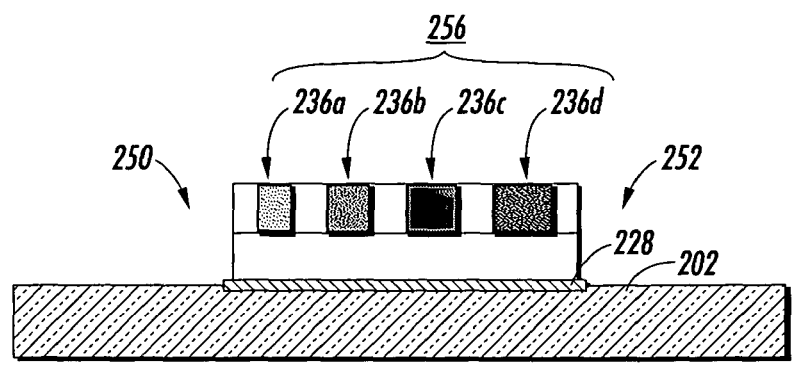
Figure 6:
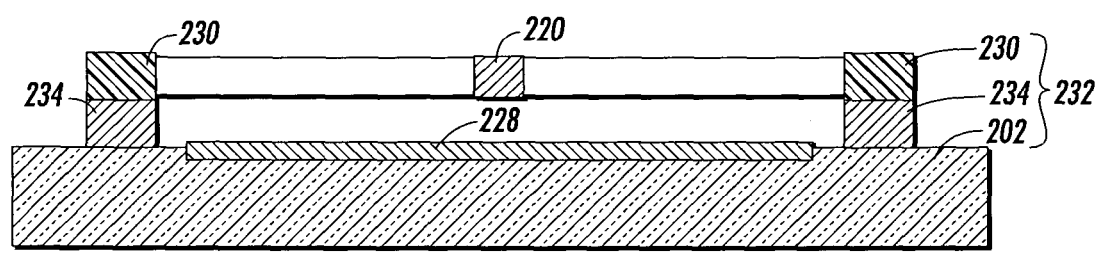

FIGS. 4–6 depict the thermal actuator 200 in greater detail.

Referring now to FIG. 4, there is shown an elevated top-down "birds-eye" view of the thermal actuator 200, including a first reference line 5 and a second reference line 6. As shown, the thermal actuator 200 comprises a substrate 202 having a surface 204; a first support 206 and a second support 208 disposed on the surface and extending orthogonally therefrom, a plurality of beams 212a–212d extending in parallel between the first support and the second support, thus forming a beam array 214, each beam being agonic and substantially straight; each beam of the beam array having a beam width 226 with a corresponding beam width value, the beams in the beam array having beam width values that vary based on a predetermined pattern; and an included coupling beam 220 extending orthogonally across the beam array to couple each array beam substantially at its midpoint.

The predetermined pattern is characterized in that, across the beam array 214 from one side 250 of the beam array to the opposite side 252 of the beam array, successive beam width values do not decrease and at least sometimes increase.

Each pair 222 of adjacent beams in the beam array 214 has a beam spacing 224 with a corresponding beam spacing value, with all such pairs of adjacent beams in the beam array having substantially the same beam spacing value.

As shown in FIG. 4, with cross-reference to FIGS. 5–6, in one embodiment, the thermal actuator 200 includes a heater layer 228 disposed on the surface facing the plurality of beams and arranged to heat the plurality of beams. The heater layer is coupled to a heater layer input 238 and a heater layer output 240 and arranged to cause or form a heating of the plurality of beams.

The heater layer 228 can be thermally isolated from the substrate as described in U.S. Pat. No. 5,706,041 and U.S. Pat. No. 5,851,412 to Joel Kubby, both of which patents are incorporated by reference herein.

Further, in one embodiment, each beam of the plurality of beams is arranged to be heated by a beam heating current 246 supplied by an included beam input 242 and beam output 244, thus resulting in a heating of the plurality of beams.

The plurality of beams can be thermally isolated from the substrate as described in the application of Joel Kubby, U.S. patent application Ser. No. 09/683,533, filed Jan. 16, 2002, now U.S. Patent Application Publication No. 20030134445, published Jul. 17, 2003, which patent application is incorporated by reference herein.

As shown, the plurality of beams is arranged so that the heating of the plurality of beams causes a beam buckling and the coupling beam to translate in a predetermined direction 248. In one embodiment, the heating of the plurality of beams is supplied by the heater layer 228. In another embodiment, the heating of the plurality of beams is supplied by the beam heating current 246. In still another embodiment, the heating of the plurality of beams is supplied by a combination of the heater layer 228 and the beam heating current 246.

Referring generally to FIGS. 4–6, in one embodiment, each beam of the plurality of beams is fabricated of a low-conductivity material of either monocrystalline silicon or polycrystalline silicon.

In one embodiment, each beam of the plurality of beams is fabricated in a device layer 230 of a silicon-on-insulator wafer 232.

A method for fabricating the plurality of beams in a device layer of a silicon-on-insulator wafer is described in the U.S. patents to Phillip D. Floyd et al., U.S. Pat. No. 6,002,507 and U.S. Pat. No. 6,014,240; and in the U.S. Patents to Joel Kubby et al., U.S. Pat. No. 6,362,512 and U.S. Pat. No. 6,379,989, all of the foregoing patents being incorporated by reference herein.

In one embodiment, the first support 206 and second support 208 are fabricated in a buried oxide layer 234 of a silicon-on-insulator wafer 232.

Figure 7:
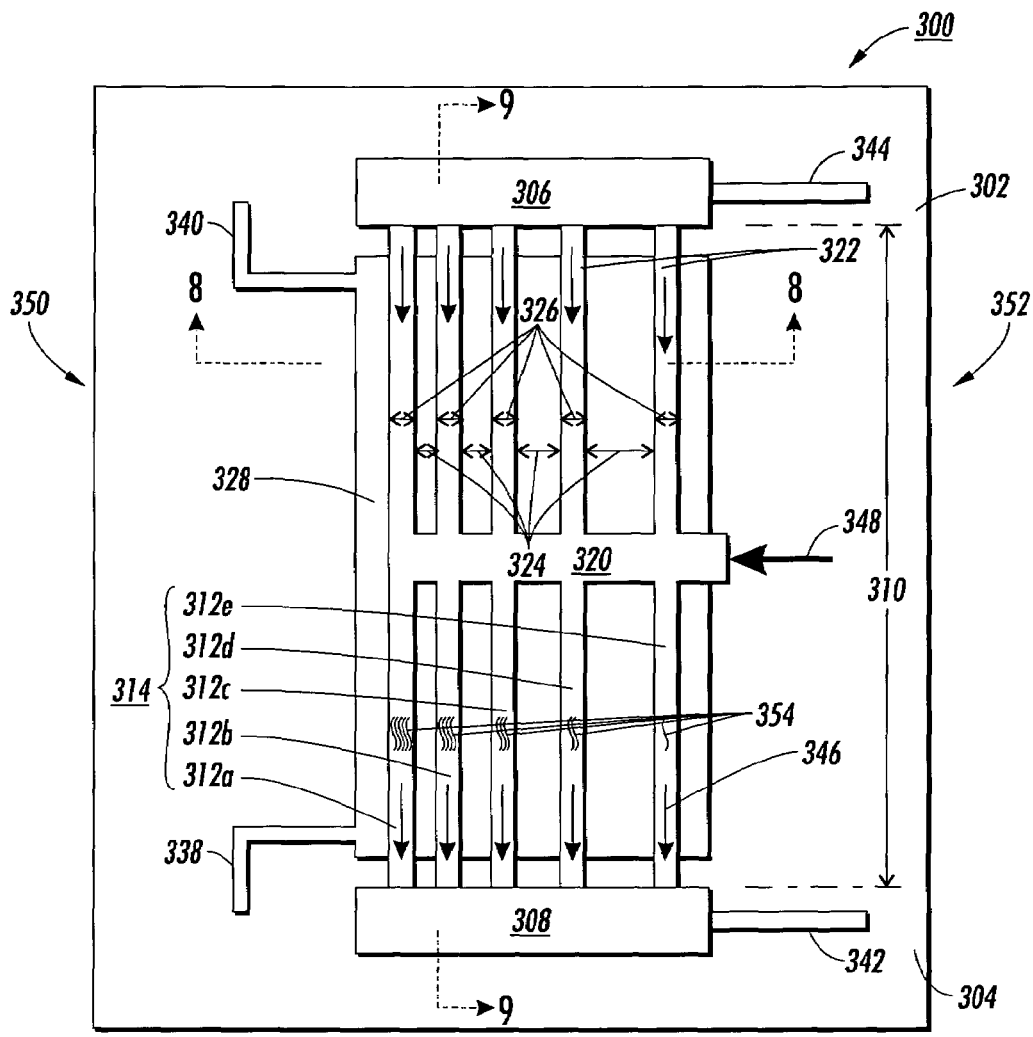
FIGS. 7–9 depict the second embodiment 300 of the thermal actuator as follows.
Figure 8:
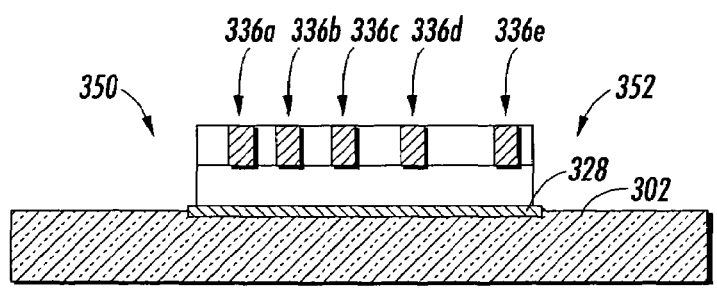
Figure 9:
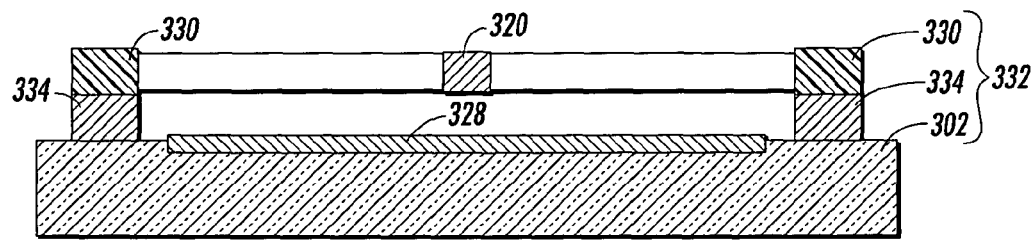

FIGS. 7–9 depict the thermal actuator 300 in greater detail.

Referring now to FIG. 7, there is shown an elevated top-down "birds-eye" view of the thermal actuator 300, including a first reference line 8 and a second reference line 9. As shown, the thermal actuator 300 comprises a substrate 302 having a surface 304; a first support 306 and a second support 308 disposed on the surface and extending orthogonally therefrom, a plurality of beams extending in parallel between the first support and the second support, thus forming a beam array 314, each beam being agonic and substantially straight; each pair 322 of adjacent beams in the beam array defining a beam spacing with a corresponding beam spacing value, the pairs of adjacent beams in the beam array having beam spacing values that vary based on a predetermined pattern; and an included coupling beam 320 extending orthogonally across the beam array to couple each array beam substantially at its midpoint.

The predetermined pattern is characterized in that, across the beam array 314 from one side 350 of the beam array to the opposite side 352 of the beam array, successive beam spacing values do not decrease and at least sometimes increase.

Each beam of the beam array 314 has a beam width 326 with a corresponding beam width value, with all beams of the beam array having substantially the same beam width value.

As shown in FIG. 7, with cross-reference to FIGS. 8–9, in one embodiment, the thermal actuator 300 includes a heater layer 328 disposed on the surface facing the plurality of beams and arranged to heat the plurality of beams. The heater layer is coupled to a heater layer input 338 and a heater layer output 340, and is arranged to cause or form a heating of the plurality of beams.

Further, in one embodiment, each beam of the plurality of beams is arranged to be heated by a beam heating current 346 supplied by an included beam input 342 and beam output 344, thus resulting in a heating of the plurality of beams.

As shown, the plurality of beams is arranged so that the heating of the plurality of beams causes a beam buckling and the coupling beam to translate in a predetermined direction 348. In one embodiment, the heating of the plurality of beams is supplied by the heater layer 328. In another embodiment, the heating of the plurality of beams is supplied by the beam heating current 346. In still another embodiment, the heating of the plurality of beams is supplied by a combination of the heater layer 328 and the beam heating current 346.

Referring generally to FIGS. 7–9, in one embodiment, each beam of the plurality of beams is fabricated of a low-conductivity material of either monocrystalline silicon or polycrystalline silicon.

In one embodiment, each beam of the plurality of beams is fabricated in a device layer 330 of a silicon-on-insulator wafer 332.

In one embodiment, the first support 306 and the second support 308 are fabricated in a buried oxide layer 334 of a silicon-on-insulator wafer 332.

Figure 10:
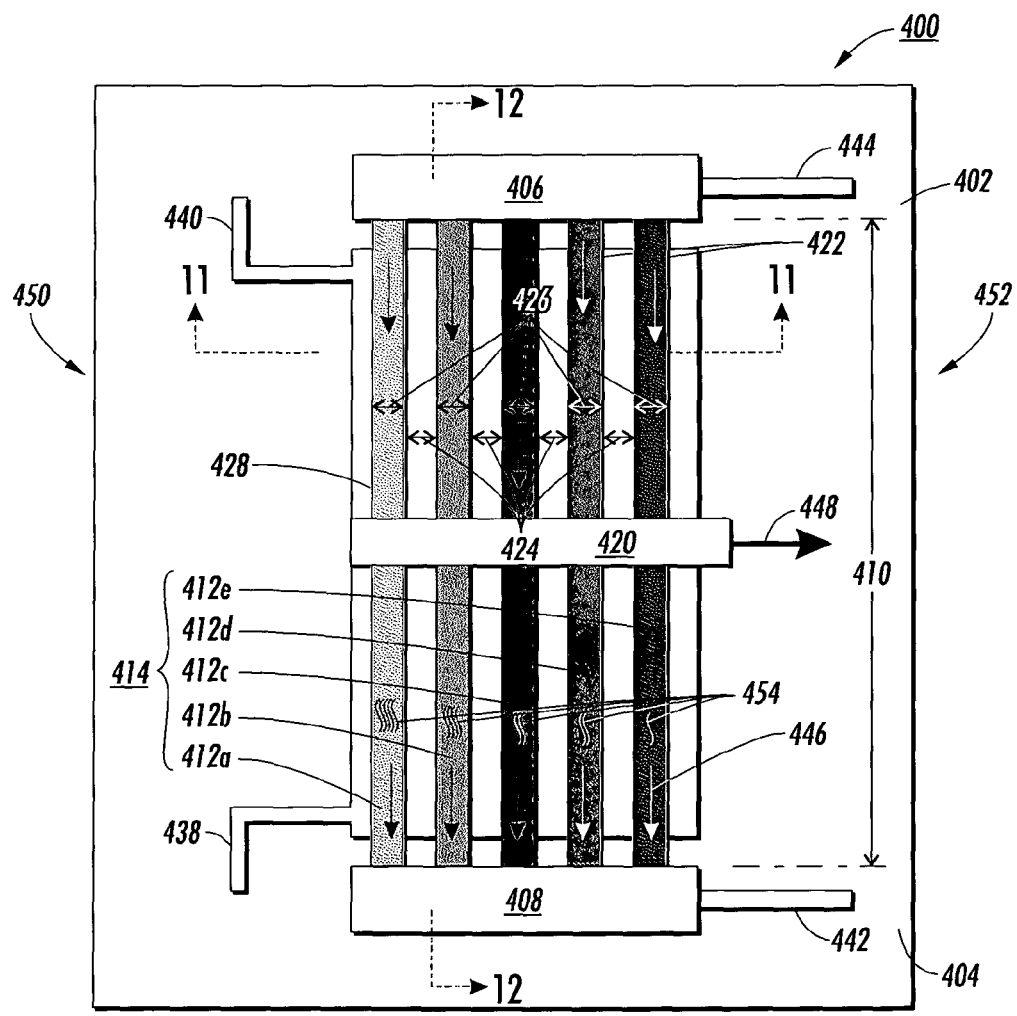
FIGS. 10–12 depict the third embodiment 400 of the thermal actuator as follows.
Figure 11:
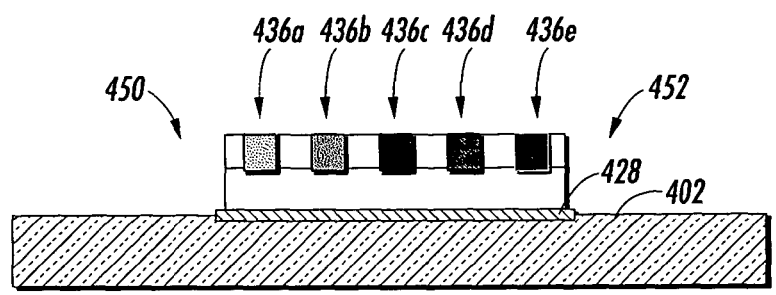
Figure 12:
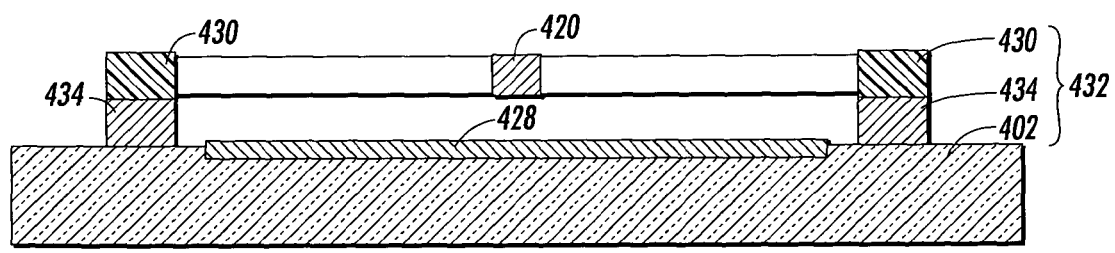

FIGS. 10–12 depict the thermal actuator 400 in greater detail.

Referring now to FIG. 10, there is shown an elevated top-down "birds-eye" view of the thermal actuator 400, including a first reference line 11 and a second reference line 12. As shown, the thermal actuator 400 comprises a substrate 402 having a surface 404; a first support 406 and a second support 408 disposed on the surface and extending orthogonally therefrom, a plurality of beams 412a–412e extending in parallel between the first support and the second support, thus forming a beam array 414, each beam being agonic and substantially straight; each beam of the beam array having a beam resistance 436 with a corresponding beam resistance value, the beams in the beam array having beam resistance values that vary based on a predetermined pattern; and an included coupling beam 420 extending orthogonally across the beam array to couple each array beam substantially at its midpoint.

The predetermined pattern is characterized in that, across the beam array 414 from one side 450 of the beam array to the opposite side 452 of the beam array, successive beam resistance values do not increase and at least sometimes decrease.

Each beam of the beam array 414 has a beam width 426 with a corresponding beam width value, with all beams of the beam array having substantially the same beam width value.

Each pair 422 of adjacent beams in the beam array 414 defines a beam spacing 424 with a corresponding beam spacing value, with all such pairs of adjacent beams in the beam array having substantially the same beam spacing value.

As shown in FIG. 10, with cross-reference to FIGS. 11–12, in one embodiment, each beam of the plurality of beams is arranged to be heated by a beam heating current 446 supplied by an included beam input 442 and beam output 444, thus causing or forming a heating of the plurality of beams.

As shown, the plurality of beams is arranged so that the heating of the plurality of beams causes a beam buckling and the coupling beam to translate in a predetermined direction 448.

Referring generally to FIGS. 10–12, in one embodiment, the thermal actuator 400 comprises a microelectromechanical or "MEMS" structure that is fabricated by any of surface and bulk micromachining.

In one embodiment, each beam of the plurality of beams is fabricated of a low-conductivity material of either monocrystalline silicon or polycrystalline silicon.

In one embodiment, each beam of the plurality of beams is fabricated in a device layer 430 of a silicon-on-insulator wafer 432.

In one embodiment, the first support 406 and the second support 408 are fabricated in a buried oxide layer 434 of a silicon-on-insulator wafer 432.

Referring again to FIGS. 4–6, there is described below a further aspect of the invention based on the thermal actuator 200.

In FIGS. 4–6 there is shown the thermal actuator 200 comprising a substrate 202 having a surface 204; a first support 206 and a second support 208 disposed on the surface and extending orthogonally therefrom, a plurality of beams 212a–212d extending in parallel between the first support and the second support, thus forming a beam array 214, each beam being agonic and substantially straight; each beam of the beam array having a beam heating parameter 254 with a corresponding beam heating parameter value, the beams in the beam array having beam heating parameter values that vary based on a predetermined pattern; and an included coupling beam 220 extending orthogonally across the beam array to couple each array beam substantially at its midpoint.

An example of a beam heating parameter 254 is the beam width 226. The beam width w will effect the heat flow $\partial Q/\partial t$ through the beam under a temperature gradient $\partial T/\partial x$ as determined by Fourier's law of heat conduction in one dimension;

$$\partial Q/\partial t = \lambda(T) A \partial T/\partial x;$$

where the beam cross-section area A is given by the product of the beam width w and the beam thickness t;

$$A=(w)(t);$$

and $\lambda(T)$ is the temperature-dependent thermal conductivity of the beam. The beam width w will also effect the heat capacity of the beam, and thus the temperature of the beam as a function of time for a given heat input Q as given in one dimension by the heat equation;

$$\rho C \partial T/\partial t - \lambda(T) \partial T^2/\partial x^2 = Q + h(T_{ext} - T)$$

where $\rho$ is the density of the beam, C is the heat capacity of the beam, h is the convective heat transfer coefficient, and $T_{ext}$ is the external temperature. For a given beam thickness t, a wider beam width w will increase the heat capacity of the beam, and thus decrease the temperature the beam will reach after a certain amount of time for a given heat input Q.

A further example of a beam heating parameter 254 is the beam spacing 224. Heat can be transferred between beams by conduction, convection and radiation. The smaller the beam spacing, the greater the heat transfer between beams. Heat lost by one beam can be transferred to a nearby beam, and vice-versa. Heat can also be lost from beams by conduction, convection and radiation to the surrounding environment. The larger the beam spacing, the greater the heat loss from a beam to the surrounding environment.

A final example of a beam heating parameter 254 is the beam electrical resistance R. The beam resistance R will effect the amount of heat Q generated by a current I flowing through a beam with a resistance R for a time t by;

$$Q = I^2 R t$$

as given by Joule's law.

Each beam of the beam array 214 is characterized by a beam temperature 236a–236d, the beam temperatures of the array beams thus forming a beam temperature distribution 256. Further, there is provided heating means to heat each beam of the plurality of beams, thus causing or forming a heating of the plurality of beams. The heating means includes any of direct current Joule heating, by passing a beam heating current such as, for example, the beam current 246 through each beam, and indirect heating by conduction, convection or radiation from a heater layer such as, for example, the heater layer 228 disposed on the substrate, by passing a heating current through the heater layer. Further, in embodiments using a heater layer, the heater layer can be thermally isolated from the substrate as described in U.S. Pat. No. 5,706,041 and U.S. Pat. No. 5,851,412 to Joel Kubby, and in U.S. Pat. No. 6,362,512 to Joel Kubby et al., all of which patents are incorporated by reference herein.

The predetermined pattern is characterized in that, across the beam array 214 from one side 250 of the beam array to the opposite side 252 of the beam array, successive beam heating parameter values are arranged so that the beam temperature distribution becomes asymmetric based on the heating of the plurality of beams.

As shown, the plurality of beams is arranged so that the heating of the plurality of beams causes a beam buckling and the coupling beam 220 to translate in a predetermined direction 248.

Further heating of the plurality of the beams causes further expansion of the beams, thus causing the coupling beam to further translate in the predetermined direction 248.

In one embodiment, the heating of the plurality of beams comprises any of Joule heating, eddy current heating, conduction heating, convection heating and radiation heating.

Referring again to FIGS. 7–9, there is described below a further aspect of the invention based on the thermal actuator 300.

In FIGS. 7–9 there is shown the thermal actuator 300 comprising a substrate 302 having a surface 304; a first support 306 and a second support 308 disposed on the surface and extending orthogonally therefrom, a plurality of beams 312a–312e extending in parallel between the first support and the second support, thus forming a beam array 314, each beam being agonic and substantially straight; each beam of the beam array having a beam heating parameter 354 with a corresponding beam heating parameter value, the beams in the beam array having beam heating parameter values that vary based on a predetermined pattern; and an included coupling beam 320 extending orthogonally across the beam array to couple each array beam substantially at its midpoint.

Each beam of the beam array 314 is characterized by a beam temperature, the beam temperatures of the array beams thus forming a beam temperature distribution. Further, there is provided heating means to heat each beam of the plurality of beams, thus causing or forming a heating of the plurality of beams. The heating means includes any of direct current Joule heating, by passing a beam heating current such as, for example, the beam current 346 through each beam, and indirect heating by conduction, convection or radiation from a heater layer such as, for example, the heater layer 328 disposed on the substrate, by passing a heating current through the heater layer. Further, in embodiments using a heater layer, the heater layer can be thermally isolated from the substrate as described in U.S. Pat. No. 5,706,041 and U.S. Pat. No. 5,851,412 to Joel Kubby, and in U.S. Pat. No. 6,362,512 to Joel Kubby et al., all of which patents are incorporated by reference herein.

The predetermined pattern is characterized in that, across the beam array 314 from one side 350 of the beam array to the opposite side 352 of the beam array, successive beam heating parameter values are arranged so that the beam temperature distribution becomes asymmetric based on the heating of the plurality of beams.

As shown, the plurality of beams is arranged so that the heating of the plurality of beams causes a beam buckling and the coupling beam 320 to translate in a predetermined direction 348.

In one embodiment, the heating of the plurality of beams comprises any of Joule heating, eddy current heating, conduction heating, convection heating and radiation heating.

Referring again to FIGS. 10–12, there is described below a further aspect of the invention based on the thermal actuator 400.

In FIGS. 10–12 there is shown the thermal actuator 400 comprising a substrate 402 having a surface 404; a first support 406 and a second support 408 disposed on the surface and extending orthogonally therefrom, a plurality of beams 412a–412e extending in parallel between the first support and the second support, thus forming a beam array 414, each beam being agonic and substantially straight; each beam of the beam array having a beam heating parameter 454 with a corresponding beam heating parameter value, the beams in the beam array having beam heating parameter values that vary based on a predetermined pattern; and an included coupling beam 420 extending orthogonally across the beam array to couple each array beam substantially at its midpoint.

Each beam of the beam array 414 is characterized by a beam temperature, the beam temperatures of the array beams thus forming a beam temperature distribution. Further, there is provided heating means to heat each beam of the plurality of beams, thus causing or forming a heating of the plurality of beams. The heating means includes any of direct current Joule heating, by passing a beam heating current such as, for example, the beam current 446 through each beam, and indirect heating by conduction, convection or radiation from a heater layer such as, for example, the heater layer 428 disposed on the substrate, by passing a heating current through the heater layer. Further, in embodiments using a heater layer, the heater layer can be thermally isolated from the substrate as described in U.S. Pat. No. 5,706,041 and U.S. Pat. No. 5,851,412 to Joel Kubby, and in U.S. Pat. No. 6,362,512 to Joel Kubby et al., all of which patents are incorporated by reference herein.

The predetermined pattern is characterized in that, across the beam array 414 from one side 450 of the beam array to the opposite side 452 of the beam array, successive beam heating parameter values are arranged so that the beam temperature distribution becomes asymmetric based on the heating of the plurality of beams.

As shown, the plurality of beams is arranged so that the heating of the plurality of beams causes a beam buckling and the coupling beam 420 to translate in a predetermined direction 448.

In one embodiment, the heating of the plurality of beams comprises any of Joule heating, eddy current heating, conduction heating, convection heating and radiation heating.

In summary, in accordance with the present invention, a thermal actuator (any of the thermal actuator 200 as depicted in FIGS. 4–6, the thermal actuator 300 as depicted in FIGS. 7–9 and the thermal actuator 400 as depicted in FIGS. 10–12) comprises a plurality of substantially straight and parallel beams (212a–212d, 312a–312e and 412a–412e) arranged to form a beam array (214, 314 and 414). The midpoint of each beam is attached or coupled to an orthogonal coupling beam (220, 320 and 420). Each array beam has a beam heating parameter (254, 354 and 454) with a corresponding beam heating parameter value. The beam heating parameter values vary across the beam array based on a predetermined pattern. As the beams are heated by an included heating means (any combination of heater layers 228, 328 and 428 and beam heating currents 246, 346 and 446), the distribution of beam temperatures in the beam array becomes asymmetric, thus causing the beam array to buckle. The buckling of the beams in the beam array, in turn, causes the attached coupling beam to move in a predetermined direction (248, 348 and 448). The coupling beam motion, in turn, operates an included optical waveguide switch (any of the thermal actuator 100a as depicted in FIG. 1, the thermal actuator 100b as depicted in FIG. 2 and the thermal actuator 100c as depicted in FIG. 3). The beams in the beam array are heated by any of Joule heating, eddy current heating, conduction heating, convection heating and radiation heating.

Thus, there has been described the first aspect of the invention based on the thermal actuator 200 as depicted in FIGS. 4–6, the thermal actuator 200 comprising a substrate 202 having a surface 204; a first support 206 and a second support 208 disposed on the surface and extending orthogonally therefrom, a plurality of beams 212a–212d extending in parallel between the first support and the second support, thus forming a beam array 214, each beam being agonic and substantially straight; each beam of the beam array having a beam width 226 with a corresponding beam width value, the beams in the beam array having beam width values that vary based on a predetermined pattern; and an included coupling beam 220 extending orthogonally across the beam array to couple each array beam substantially at its midpoint.

Also, there has been described the second aspect of the invention based on the thermal actuator 300 as depicted in FIGS. 7–9, the thermal actuator 300 comprising a substrate 302 having a surface 304; a first support 306 and a second support 308 disposed on the surface and extending orthogonally therefrom, a plurality of beams 312a–312e extending in parallel between the first support and the second support, thus forming a beam array 314, each beam being agonic and substantially straight; each pair 322 of adjacent beams in the beam array defining a beam spacing 324 with a corresponding beam spacing value, the pairs of adjacent beams in the beam array having beam spacing values that vary based on a predetermined pattern; and an included coupling beam 320 extending orthogonally across the beam array to couple each array beam substantially at its midpoint.

Also, there has been described the third aspect of the invention based on the thermal actuator 400 as depicted in FIGS. 10–12, the thermal actuator 400 comprising a substrate 402 having a surface 404; a first support 406 and a second support 408 disposed on the surface and extending orthogonally therefrom, a plurality of beams 412a–412e extending in parallel between the first support and the second support, thus forming a beam array 414, each beam being agonic and substantially straight; each beam of the beam array having a beam resistance 436 with a corresponding beam resistance value, the beams in the beam array having beam resistance values that vary based on a predetermined pattern; and an included coupling beam 420 extending orthogonally across the beam array to couple each array beam substantially at its midpoint.

Also, there has been described the fourth aspect of the invention based on the thermal actuator 200 as depicted in FIGS. 4–6, the thermal actuator 200 comprising a substrate 202 having a surface 204; a first support 206 and a second support 208 disposed on the surface and extending orthogonally therefrom, a plurality of beams 212a–212d extending in parallel between the first support and the second support, thus forming a beam array 214, each beam being agonic and substantially straight; each beam of the beam array having a beam heating parameter 254 with a corresponding beam heating parameter value, the beams in the beam array having beam heating parameter values that vary based on a predetermined pattern; and an included coupling beam 220 extending orthogonally across the beam array to couple each array beam substantially at its midpoint.

Also, there has been described the fourth aspect of the invention based on the thermal actuator 300 as depicted in FIGS. 7–9, the thermal actuator 300 comprising a substrate 302 having a surface 304; a first support 306 and a second support 308 disposed on the surface and extending orthogonally therefrom, a plurality of beams 312a–312e extending in parallel between the first support and the second support, thus forming a beam array 314, each beam being agonic and substantially straight; each beam of the beam array having a beam heating parameter 354 with a corresponding beam heating parameter value, the beams in the beam array having beam heating parameter values that vary based on a predetermined pattern; and an included coupling beam 320 extending orthogonally across the beam array to couple each array beam substantially at its midpoint.

Also, there has been described the fourth aspect of the invention based on the thermal actuator 400 as depicted in FIGS. 10–12, the thermal actuator 400 comprising a substrate 402 having a surface 404; a first support 406 and a second support 408 disposed on the surface and extending orthogonally therefrom, a plurality of beams 412a–412e extending in parallel between the first support and the second support, thus forming a beam array 414, each beam being agonic and substantially straight; each beam of the beam array having a beam heating parameter 454 with a corresponding beam heating parameter value, the beams in the beam array having beam heating parameter values that vary based on a predetermined pattern; and an included coupling beam 420 extending orthogonally across the beam array to couple each array beam substantially at its midpoint.

Also, there has been described the fifth aspect of the invention based on the optical waveguide switch 100a as depicted in FIGS. 1 and 4–6, the optical waveguide switch 100a comprising the thermal actuator 200, the thermal actuator 200 comprising a substrate 202 having a surface 204; a first support 206 and a second support 208 disposed on the surface and extending orthogonally therefrom, a plurality of beams 212a–212d extending in parallel between the first support and the second support, thus forming a beam array 214, each beam being agonic and substantially straight; each beam of the beam array having a beam width 226 with a corresponding beam width value, the beams in the beam array having beam width values that vary based on a predetermined pattern; and an included coupling beam 220 extending orthogonally across the beam array to couple each array beam substantially at its midpoint.

Also, there has been described the sixth aspect of the invention based on the optical waveguide switch 100b as depicted in FIGS. 2 and 7–9, the optical waveguide switch 100b comprising the thermal actuator 300, the thermal actuator 300 comprising a substrate 302 having a surface 304; a first support 306 and a second support 308 disposed on the surface and extending orthogonally therefrom, a plurality of beams 312a–312e extending in parallel between the first support and the second support, thus forming a beam array 314, each beam being agonic and substantially straight; each pair 322 of adjacent beams in the beam array defining a beam spacing 324 with a corresponding beam spacing value, the pairs of adjacent beams in the beam array having beam spacing values that vary based on a predetermined pattern; and an included coupling beam 320 extending orthogonally across the beam array to couple each array beam substantially at its midpoint.

Also, there has been described the seventh aspect of the invention based on the optical waveguide switch 100c as depicted in FIGS. 3 and 10–12, the optical waveguide switch 100c comprising the thermal actuator 400, the thermal actuator 400 comprising a substrate 402 having a surface 404; a first support 406 and a second support 408 disposed on the surface and extending orthogonally therefrom, a plurality of beams 412a–412e extending in parallel between the first support and the second support, thus forming a beam array 414, each beam being agonic and substantially straight; each beam of the beam array having a beam resistance 436 with a corresponding beam resistance value, the beams in the beam array having beam resistance values that vary based on a predetermined pattern; and an included coupling beam 420 extending orthogonally across the beam array to couple each array beam substantially at its midpoint.

Also, there has been described the eighth aspect of the invention based on the optical waveguide switch 100a as depicted in FIGS. 1 and 4–6, the optical waveguide switch 100a comprising the thermal actuator 200, the thermal actuator 200 comprising a substrate 202 having a surface 204; a first support 206 and a second support 208 disposed on the surface and extending orthogonally therefrom, a plurality of beams 212a–212d extending in parallel between the first support and the second support, thus forming a beam array 214, each beam being agonic and substantially straight; each beam of the beam array having a beam heating parameter 254 with a corresponding beam heating parameter value, the beams in the beam array having beam heating parameter values that vary based on a predetermined pattern; and an included coupling beam 220 extending orthogonally across the beam array to couple each array beam substantially at its midpoint.

Also, there has been described the eighth aspect of the invention based on the optical waveguide switch 100b as depicted in FIGS. 2 and 7–9, the optical waveguide switch 100b comprising the thermal actuator 300, the thermal actuator 300 comprising a substrate 302 having a surface 304; a first support 306 and a second support 308 disposed on the surface and extending orthogonally therefrom, a plurality of beams 312a–312e extending in parallel between the first support and the second support, thus forming a beam array 314, each beam being agonic and substantially straight; each beam of the beam array having a beam heating parameter 354 with a corresponding beam heating parameter value, the beams in the beam array having beam heating parameter values that vary based on a predetermined pattern; and an included coupling beam 320 extending orthogonally across the beam array to couple each array beam substantially at its midpoint.

Also, there has been described the eighth aspect of the invention based on the optical waveguide switch 100c as depicted in FIGS. 3 and 10–12, the optical waveguide switch 100c comprising the thermal actuator 400, the thermal actuator 400 comprising a substrate 402 having a surface 404; a first support 406 and a second support 408 disposed on the surface and extending orthogonally therefrom, a plurality of beams 412a–412e extending in parallel between the first support and the second support, thus forming a beam array 414, each beam being agonic and substantially straight; each beam of the beam array having a beam heating parameter 454 with a corresponding beam heating parameter value, the beams in the beam array having beam heating parameter values that vary based on a predetermined pattern; and an included coupling beam 420 extending orthogonally across the beam array to couple each array beam substantially at its midpoint.

Moreover, in each of the foregoing aspects of the invention, the beams in the thermal actuator are agonic and substantially straight, so there is no transverse component of force from residual stress in the beams that would tend to deflect them from their originally-designed target location.

The table below lists the drawing element reference numbers together with their corresponding written description:

| Number: | Description: |
|---|---|
| 100a | optical waveguide switch comprising the thermal actuator 200 |
| 100b | optical waveguide switch comprising the thermal actuator 300 |
| 100c | optical waveguide switch comprising the thermal actuator 400 |
| 200 | first embodiment of a thermal actuator |
| 202 | substrate |
| 204 | surface of the substrate 202 |
| 206 | first support |
| 208 | second support |
| 210 | support spacing |
| 212a–212d | plurality of beams |
| 214 | beam array |
| 216 | first beam of the beam array 214 |
| 218 | last beam of the beam array 214 |
| 220 | coupling beam |
| 222 | pair of adjacent beams in the beam array 214 |
| 224 | beam spacing |
| 226 | beam width |
| 228 | heater layer |
| 230 | device layer |
| 232 | silicon-on-insulator wafer |
| 234 | buried oxide layer |
| 236 | beam temperature |
| 238 | heater layer input |
| 240 | heater layer output |
| 242 | beam input |
| 244 | beam output |
| 246 | beam heating current |
| 248 | predetermined direction |
| 250 | one side of the beam array 214 |
| 252 | opposite side of the beam array 214 |
| 254 | beam heating parameter |
| 256 | beam temperature distribution of the beam array 214 |
| 300 | second embodiment of a thermal actuator |
| 302 | substrate |
| 304 | surface of the substrate 302 |
| 306 | first support |
| 308 | second support |
| 310 | support spacing |
| 312a–312e | plurality of beams |
| 314 | beam array |
| 316 | first beam of the beam array 314 |
| 318 | last beam of the beam array 314 |
| 320 | coupling beam |
| 322 | pair of adjacent beams in the beam array 314 |
| 324 | beam spacing |
| 326 | beam width |
| 328 | heater layer |
| 330 | device layer |
| 332 | silicon-on-insulator wafer |
| 334 | buried oxide layer |
| 336 | beam resistance |
| 338 | heater layer input |
| 340 | heater layer output |
| 342 | beam input |
| 344 | beam output |
| 346 | beam heating current |
| 348 | predetermined direction |
| 350 | one side of the beam array 314 |
| 352 | opposite side of the beam array 314 |
| 354 | beam heating parameter |
| 400 | third embodiment of a thermal actuator |
| 402 | substrate |
| 404 | surface of the substrate 402 |
| 406 | first support |
| 408 | second support |
| 410 | support spacing |
| 412a–412e | plurality of beams |
| 414 | beam array |
| 416 | first beam of the beam array 414 |
| 418 | last beam of the beam array 414 |
| 420 | coupling beam |
| 422 | pair of adjacent beams in the beam array 414 |
| 424 | beam spacing |
| 426 | beam width |

-continued

| Number: | Description: |
|---|---|
| 428 | heater layer |
| 430 | device layer |
| 432 | silicon-on-insulator wafer |
| 434 | buried oxide layer |
| 436 | beam resistance |
| 438 | heater layer input |
| 440 | heater layer output |
| 442 | beam input |
| 444 | beam output |
| 446 | beam heating current |
| 448 | predetermined direction |
| 450 | one side of the beam array 414 |
| 452 | opposite side of the beam array 414 |
| 454 | beam heating parameter |

While various embodiments of a thermal actuator and an optical waveguide switch including the same, in accordance with the present invention, have been described hereinabove, the scope of the invention is defined by the following claims.

What is claimed is:

1. A thermal actuator (200) comprising:
a substrate having a surface;
a first support and a second support disposed on the surface and extending orthogonally therefrom, a plurality of beams (212a–212d) extending in parallel between the first support and the second support, thus forming a beam array (214), each beam being agonic and substantially straight;
each beam of the beam array having a beam width (226) with a corresponding beam width value, the beams in the beam array having beam width values that vary based on a predetermined pattern; and
an included coupling beam extending orthogonally across the beam array to couple each array beam substantially at its midpoint;
wherein the predetermined pattern is characterized in that extending orthogonally, across the beam array (214) from one side (250) to the opposite side (252), the beam width values of successive beam widths (226) do not decrease and at least sometimes increase.

2. The thermal actuator of claim 1, each pair of adjacent beams in the beam array defining a beam spacing with a corresponding beam spacing value, with all such pairs of adjacent beams in the beam array having substantially the same beam spacing value.

3. The thermal actuator of claim 1, including a heater layer disposed on the surface facing the plurality of beams and arranged to heat the plurality of beams, the heater layer coupled to a heater layer input and a heater layer output, thus forming a heating of the plurality of beams.

4. The thermal actuator of claim 3, the plurality of beams arranged so that the heating of the plurality of beams causes a beam buckling and the coupling beam to translate in a predetermined direction.

5. The thermal actuator of claim 1, wherein each beam of the plurality of beams is fabricated of a low-conductivity material of either monocrystalline silicon or polycrystalline silicon.

6. The thermal actuator of claim 5, each beam of the plurality of beams arranged to be heated by a beam heating current supplied by an included beam input and beam output, thus forming a heating of the plurality of beams.

7. The thermal actuator of claim 6, the plurality of beams arranged so that the heating of the plurality of beams causes a beam buckling and the coupling beam to translate in a predetermined direction.

8. The thermal actuator of claim 1, wherein each beam of the plurality of beams is fabricated in a device layer of a silicon-on-insulator wafer.

9. The thermal actuator of claim 8, wherein the first support and the second support are fabricated in a buried oxide layer of a silicon-on-insulator wafer.

10. A thermal actuator (300) comprising:
a substrate having a surface;
a first support and a second support disposed on the surface and extending orthogonally therefrom, a plurality of beams (312a–312e) extending in parallel between the first support and the second support, thus forming a beam array (314), each beam being agonic and substantially straight;
each pair of adjacent beams in the beam array defining a beam spacing (324) with a corresponding beam spacing value, the pairs of adjacent beams in the beam array having beam spacing values that vary based on a predetermined pattern; and
an included coupling beam extending orthogonally across the beam array to couple each array beam substantially at its midpoint;
wherein the predetermined pattern is characterized in that extending orthogonally, across the beam array (314) from one side (350) to the opposite side (352), the beam spacing values of successive beam spacings (324) do not decrease and at least sometimes increase.

11. The thermal actuator of claim 10, each beam of the beam array having a beam width with a corresponding beam width value, with all beams of the beam array having substantially the same beam width value.

12. The thermal actuator of claim 10, including a heater layer disposed on the surface facing the plurality of beams and arranged to heat the plurality of beams, the heater layer coupled to a heater layer input and a heater layer output, thus forming a heating of the plurality of beams.

13. The thermal actuator of claim 12, the plurality of beams arranged so that the heating of the plurality of beams causes a beam buckling and the coupling beam to translate in a predetermined direction.

14. The thermal actuator of claim 10, wherein each beam of the plurality of beams is fabricated of a low-conductivity material of either monocrystalline silicon or polycrystalline silicon.

15. The thermal actuator of claim 14, each beam of the plurality of beams arranged to be heated by a beam heating current supplied by an included beam input and beam output, thus forming a heating of the plurality of beams.

16. The thermal actuator of claim 15, the plurality of beams arranged so that the heating of the plurality of beams causes a beam buckling and the coupling beam to translate in a predetermined direction.

17. The thermal actuator of claim 10, wherein each beam of the plurality of beams is fabricated in a device layer of a silicon-on-insulator wafer.

18. The thermal actuator of claim 17, wherein the first support and the second support are fabricated in a buried oxide layer of a silicon-on-insulator wafer.

19. A thermal actuator (400) comprising:
a substrate having a surface;
a first support and a second support disposed on the surface and extending orthogonally therefrom, a plurality of beams (412a–412e) extending in parallel between the first support and the second support, thus forming a beam array (414), each beam being agonic and substantially straight;
each beam of the beam array having a beam resistance (436a–436e) with a corresponding beam resistance value, the beams in the beam array having beam resistance values that vary based on a predetermined pattern; and
an included coupling beam extending orthogonally across the beam array to couple each array beam substantially at its midpoint;
wherein the predetermined pattern is characterized in that extending orthogonally, across the beam array (414) from one side (450) to The opposite side (452), the beam resistance values of successive beam resistances (436a–436e) do not increase and at least sometimes decrease.

20. The thermal actuator of claim 19, comprising a microelectromechanical structure that is fabricated by any of surface and bulk micromachining.

21. The thermal actuator of claim 20, each beam of the beam array having a beam width with a corresponding beam width value, with all beams of the beam array having substantially the same beam width value.

22. The thermal actuator of claim 20, each pair of adjacent beams in the beam array defining a beam spacing with a corresponding beam spacing value, with all such pairs of adjacent beams in the beam array having substantially the same beam spacing value.

23. The Thermal actuator of claim 19, wherein each beam of the plurality of beams is fabricated of a low-conductivity material of either monocrystalline silicon or polycrystalline silicon.

24. The thermal actuator of claim 23, each beam of the plurality of beams arranged to be heated by a beam heating current supplied by an included beam input and beam output, thus forming a heating of the plurality of beams.

25. The thermal actuator of claim 24, the plurality of beams arranged so that the heating of the plurality of beams causes a beam buckling and the coupling beam to translate in a predetermined direction.

26. The thermal actuator of claim 19, wherein each beam of the plurality of beams is fabricated in a device layer of a silicon-on-insulator wafer.

27. The thermal actuator of claim 26, wherein the first support and the second support are fabricated in a buried oxide layer of a silicon-on-insulator wafer.

28. A thermal actuator (200) comprising:
a substrate having a surface;
a first support and a second support disposed on the surface and extending orthogonally therefrom, a plurality of beams (212a–212d) extending in parallel between the first support and the second support, thus forming a beam array (214), each beam being agonic and substantially straight;
each beam of the beam array having a beam heating parameter (254) with a corresponding beam heating parameter value, the beams in the beam array having beam heating parameter values that vary based on a predetermined pattern; and
an included coupling beam (220) extending orthogonally across the beam array to couple each array beam substantially at its midpoint, each beam of the beam array characterized by a beam temperature (236a–236d), the beam temperatures of the array beams thus forming a beam temperature distribution (256), the thermal actuator further comprising means to heat each beam of the plurality of beams, thus forming a heating of the plurality of beams, the predetermined pattern characterized in that, across the beam array (214) from one side (250) to the opposite side (252) successive beam heating parameter values are arranged so that the beam temperature distribution becomes asymmetric based on the heating of the plurality of beams, the plurality of beams arranged so that the heating of the plurality of beams causes a beam buckling and the coupling beam (220) to translate in a predetermined direction (248).

29. The thermal actuator of claim 28, wherein the heating of the plurality of beams comprises any of Joule heating, eddy current heating, conduction heating, convection heating and radiation heating.

30. An optical waveguide switch (100a) comprising a thermal actuator (200), the Thermal actuator comprising;
   a substrate having a surface;
   a first support and a second support disposed on the surface and extending orthogonally therefrom, a plurality of beams (212a–212d) extending in parallel between the first support and the second support, thus forming a beam array (214), each beam being agonic and substantially straight;
   each beam of the beam array having a beam width (226) with a corresponding beam width value, the beams in the beam array having beam width values that vary based on a predetermined pattern; and
   an included coupling beam extending orthogonally across the beam array to couple each army beam substantially at its midpoint;
   wherein the predetermined pattern is characterized in that extending orthogonally, across the beam array (214) from one side (250) to the opposite side (252), the beam width values of successive beam widths (226) do not decrease and at least sometimes increase.

31. The optical waveguide switch of claim 30, each pair of adjacent beams in the beam array defining a beam spacing with a corresponding beam spacing value, with all such pairs of adjacent beams in the beam array having substantially the same beam spacing value.

32. The optical waveguide switch of claim 30, including a heater layer disposed on the surface facing the plurality of beams and arranged to heat the plurality of beams, the heater layer coupled to a heater layer input and a heater layer output, thus forming a heating of the plurality of beams.

33. The optical waveguide switch of claim 32, the plurality of beams arranged so that the heating of the plurality of beams causes a beam buckling and the coupling beam to translate in a predetermined direction.

34. The optical waveguide switch of claim 30, wherein each beam of the plurality of beams is fabricated of a low-conductivity material of either monocrystalline silicon or polycrystalline silicon.

35. The optical waveguide switch of claim 34, each beam of the plurality of beams arranged to be heated by a beam heating current supplied by an included beam input and beam output, thus forming a heating of the plurality of beams.

36. The optical waveguide switch of claim 35, the plurality of beams arranged so that the heating of the plurality of beams causes a beam buckling and the coupling beam to translate in a predetermined direction.

37. The optical waveguide switch of claim 30, wherein each beam of the plurality of beams is fabricated in a device layer of a silicon-on-insulator wafer.

38. The optical waveguide switch of claim 37, wherein the first support and the second support are fabricated in a buried oxide layer of a silicon-on-insulator wafer.

39. An optical waveguide switch (100b) comprising a thermal actuator (300), the thermal actuator comprising:
   a substrate having a surface;
   a first support and a second support disposed on the surface and extending orthogonally therefrom, a plurality of beams (312a–312e) extending in parallel between the first support and the second support, thus forming a beam array (314), each beam being agonic and substantially straight;
   each pair of adjacent beams in the beam array defining a beam spacing (324) with a corresponding beam spacing value, the pairs of adjacent beams in the beam array having beam spacing values that vary based on a predetermined pattern; and
   an included coupling beam extending orthogonally across the beam array to couple each array beam substantially at its midpoint;
   wherein the predetermined pattern is characterized in that extending orthogonally, across the beam array (314) from one side (350) to the opposite side (352), the beam spacing values of successive beam spacings (324) do not decrease and at least sometimes increase.

40. The optical waveguide switch of claim 39, each beam of the beam array having a beam width with a corresponding beam width value, with all beams of the beam array having substantially the same beam width value.

41. The optical waveguide switch of claim 39, including a heater layer disposed on the surface facing the plurality of beams and arranged to heat the plurality of beams, the heater layer coupled to a heater layer input and a heater layer output, thus forming a heating of the plurality of beams.

42. The optical waveguide switch of claim 41, the plurality of beams arranged so that the heating of the plurality of beams causes a beam buckling and the coupling beam to translate in a predetermined direction.

43. The optical waveguide switch of claim 39, wherein each beam of the plurality of beams is fabricated of a low-conductivity material of either monocrystalline silicon or polycrystalline silicon.

44. The optical waveguide switch of claim 43, each beam of the plurality of beams arranged to be heated by a beam heating current supplied by an included beam input and beam output, thus forming a heating of the plurality of beams.

45. The optical waveguide switch of claim 44, the plurality of beams arranged so that the heating of the plurality of beams causes a beam buckling and the coupling beam to translate in a predetermined direction.

46. The optical waveguide switch of claim 39, wherein each beam of the plurality of beams is fabricated in a device layer of a silicon-on-insulator wafer.

47. The optical waveguide switch of claim 46, wherein the first support and the second support are fabricated in a buried oxide layer of a silicon-on-insulator wafer.

48. An optical waveguide switch (100c) comprising a thermal actuator (400), the thermal actuator comprising:
   a substrate having a surface;
   a first support and a second support disposed on the surface and extending orthogonally therefrom, a plurality of beams (412a–412e) extending parallel between the first support and the second support, thus forming a beam array (414), each beam being agonic and substantially straight;

each beam of the beam array having a beam resistance (436a–436e) with a corresponding beam resistance value, the beams in the beam array having beam resistance values that vary based on a predetermined pattern; and an included coupling beam extending orthogonally across the beam array to couple each array beam substantially at its midpoint;

wherein the predetermined pattern is characterized in that extending orthogonally, across the beam array (414) from one side (450) to the opposite side (452), the beam resistance values of successive beam resistances (436a–436e) do not increase and at least sometimes decrease.

49. The optical waveguide switch of claim 48, comprising a microelectromechanical structure that is fabricated by any of surface and bulk micromachining.

50. The optical waveguide switch of claim 49, each beam of the beam array having a beam width with a corresponding beam width value, with all beams of the beam array having substantially the same beam width value.

51. The optical waveguide switch of claim 49, each pair of adjacent beams in the beam array defining a beam spacing with a corresponding beam spacing value, with all such pairs of adjacent beams in the beam array having substantially the same beam spacing value.

52. The optical waveguide switch of claim 48, wherein each beam of the plurality of beams is fabricated of a low-conductivity material of either monocrystalline silicon or polycrystalline silicon.

53. The optical waveguide switch of claim 52, each beam of the plurality of beams arranged to be heated by a beam heating current supplied by an included beam input and beam output, thus forming a heating of the plurality of beams.

54. The optical waveguide switch of claim 53, the plurality of beams arranged so that the heating of the plurality of beams causes a beam buckling and the coupling beam to translate in a predetermined direction.

55. The optical waveguide switch of claim 48, wherein each beam of the plurality of beams is fabricated in a device layer of a silicon-on-insulator wafer.

56. The optical waveguide switch of claim 55, wherein the first support and the second support are fabricated in a buried oxide layer of a silicon-on-insulator wafer.

57. An optical waveguide switch (100a) comprising a thermal actuator (200), the thermal actuator comprising:

a substrate having a surface;

a first support and a second support disposed on the surface and extending orthogonally therefrom, a plurality of beams (212a–212d) extending in parallel between the first support and the second support, thus forming a beam array (214), each beam being agonic and substantially straight;

each beam of the beam array having a beam heating parameter (254) with a corresponding beam heating parameter value, the beams in the beam array having beam heating parameter values that vary based on a predetermined pattern; and an included coupling beam (220) extending orthogonally across the beam array to couple each array beam substantially at its midpoint, each beam of the beam array characterized b a beam temperature (236a–236d), the beam temperatures of the array beams thus forming a beam temperature distribution (256), the thermal actuator further comprising means to heat each beam of the plurality of beams, thus forming a heating of the plurality of beams, the predetermined pattern characterized in that, across the beam array (214) from one side (250) to the opposite side (252), successive beam heating parameter values are arranged so that the beam temperature distribution becomes asymmetric based on the heating of the plurality of beams, the plurality of beams arranged so that the heating of the plurality of beams causes a beam buckling and the coupling beam (220) to translate in a predetermined direction (248).

58. The optical waveguide switch of claim 57, wherein the heating of the plurality of beams comprises any of Joule heating, eddy current heating, conduction heating, convection heating and radiation heating.

\* \* \* \* \*